(12) United States Patent
Oster et al.

(10) Patent No.: US 9,824,901 B2
(45) Date of Patent: Nov. 21, 2017

(54) COMPLEX CAVITY FORMATION IN MOLDED PACKAGING STRUCTURES

(71) Applicant: Intel Corporation, Santa Clara, CA (US)

(72) Inventors: Sasha Oster, Chandler, AZ (US); Adel A. Elsherbini, Chandler, AZ (US); Joshua D. Heppner, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/085,538

(22) Filed: Mar. 30, 2016

(65) Prior Publication Data

US 2017/0287736 A1    Oct. 5, 2017

(51) Int. Cl.
   *H01L 21/56* (2006.01)
   *H01L 23/31* (2006.01)

(52) U.S. Cl.
   CPC .......... *H01L 21/565* (2013.01); *H01L 23/315* (2013.01)

(58) Field of Classification Search
   CPC . H01L 23/562; H01L 21/568; H01L 23/3114; H01L 2224/48091; H01L 2924/00014; H01L 21/6835; H01L 23/552; H01L 2924/181; H01L 21/565; H01L 23/315
   See application file for complete search history.

(56) References Cited

U.S. PATENT DOCUMENTS

2011/0298137 A1*  12/2011  Pagaila ............... H01L 21/561
                                                    257/773

* cited by examiner

*Primary Examiner* — Jasmine Clark
(74) *Attorney, Agent, or Firm* — Schwegman Lundberg & Woessner, P.A.

(57) ABSTRACT

Molded electronics package cavities are formed by placing a sacrificial material in the mold and then decomposing, washing, or etching away this sacrificial material. The electronics package that includes this sacrificial material is then overmolded, with little or no change needed in the overmolding process. Following overmolding, the sacrificial material is removed such as using a thermal, chemical, optical, or other decomposing process. This proposed use of sacrificial material allows for formation of complex 3-D cavities, and reduces or eliminates the need for precise material removal tolerances. Multiple instances of the sacrificial material may be removed simultaneously, replacing a serial drilling process with a parallel material removal manufacturing process.

21 Claims, 6 Drawing Sheets

COMPLEX CAVITY FORMATION IN MOLDED PACKAGING STRUCTURES

TECHNICAL FIELD

Embodiments described herein generally relate to formation of complex cavities in molded electronic package structures.

BACKGROUND

There is an increasing demand and need for wearable devices, small form factor devices, and device-to-device communications (e.g., Internet of Things (IoT)), there is growing demand and need for applying a mold to electronics packages to form an overmolded electronics package. Packages may be overmolded for many reasons. Overmolding a package can provide various desirable properties, such as mechanical strength, thickness, or a layer to reduce accidental electrostatic discharge (ESD). Mechanical strength may be desirable for an otherwise fragile package. Strength, thickness, or ESD insulation may improve the ability to handle various packages, especially very thin packages. An overmold may serve to protect integrated circuit (IC) dies or passive electronic components on a package. Packages can be overmolded to obscure which electronics components are used, for aesthetic purposes, or to enable marking for tracking or authenticity detection.

While package overmolding provides various useful functions, package overmolding also undesirably increases the package height (e.g., z-height), often without adding increased electrical functionality. Additionally, some components require exposure, such as sensors or connectors, but these components may be obstructed by an overmold.

DESCRIPTION OF EMBODIMENTS

Figure 1A:
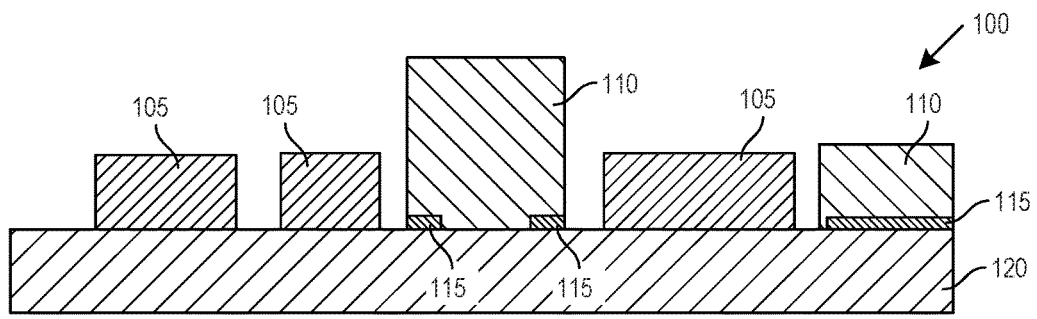
FIGS. 1A-1D are block diagrams of sacrificial material cavity formation, in accordance with at least one embodiment of the invention.

Some solutions for creating openings in molded packages include laser cutting or mechanical drilling. These solutions may be augmented by using a molding enclosure (e.g., mold chase) that creates a surface vacancy using enclosure surface features, or by using a top-down chamfer (e.g., edge beveling) or removable insert. The openings that can be created using these methods may be limited to openings that can be accomplished through a removable insert or a drilling process (e.g., laser or mechanical drill), and do not allow complex 3-D cavities. These processes may be performed serially (e.g., drilling one hole at a time), which is time-consuming. Some components may require precise opening tolerances, such as when drilling an opening above an optical sensor. These precise tolerances may require extensive process development or the addition of a drilling stop, such as applying a solder layer to act as a laser stop.

Thus, it is desirable to improve overmolding electronics packages while reducing the difficulties associated with the overmolding processes.

The present subject matter includes creating structures (e.g., cavities) within an overmold by placing a sacrificial material in the mold and then decomposing, washing, or etching away this sacrificial material. The sacrificial material can be applied to an electronics package using various processes, including being dispensed, being applied through a stencil print process, or being 3-D printed. The sacrificial material can included a preformed structure that is placed on an electronics package as part of an electronics package assembly process. An electronics package that includes this sacrificial material is then overmolded, with little or no change needed in the overmolding process. The sacrificial material is removed following an overmolding process, such as using a thermal, chemical, optical, or other decomposing process.

The proposed use of sacrificial material provides technical solutions to technical problems facing overmolded electronics packages. This proposed use of sacrificial material reduces the technical complexity and costs associated with the overmolding process. For example, this use of sacrificial material allows for formation of complex 3-D cavities that are impractical or impossible to realize using a removable insert or a drilling process. This use of sacrificial material reduces or eliminates the need for precise material removal tolerances. For example, instead of requiring a solder or copper layer for a laser stop, a sacrificial material may be removed completely to expose an optical sensor, a connector, or an electrical contact (e.g., pad, land) on the electronics package. Additionally, multiple instances of the sacrificial material may be removed simultaneously, thereby replacing a serial drilling process with a parallel material removal manufacturing process. These and other features of the proposed use of sacrificial material are described herein.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

FIGS. 1A-1D are block diagrams of sacrificial material cavity formation 100, in accordance with at least one embodiment of the invention. FIGS. 1A-D shows a generalized process flow for creating complex cavities and structures, such as in an electronic package. In this embodiment, the electronics package includes a package substrate 120, such as a printed circuit board (PCB). The electronic package formation includes placement of electrical contacts 115 or electronics devices 105, such as surface-mount devices (SMD) placed using traditional surface-mount technology (SMT) manufacturing processes. One or more sacrificial material structures 110 are placed on the substrate 120 or contacts 115. In an example, the sacrificial structures 110 are dispensed or placed when passive components or dies are placed, such as using traditional SMT manufacturing processes. In another example, sacrificial structures 110 are applied through a stencil print process or may be 3-D printed.

Figure 1B:
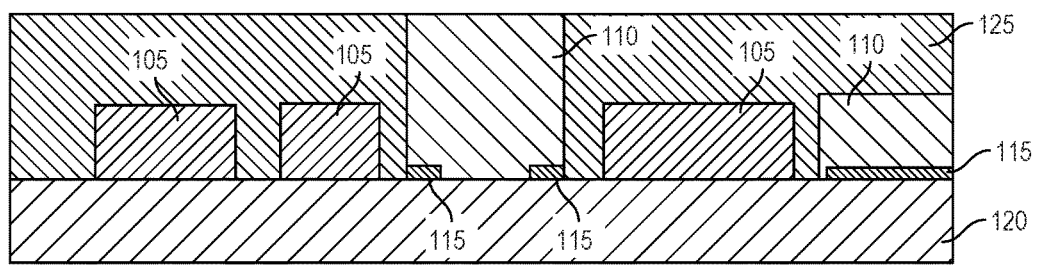
Figure 1C:
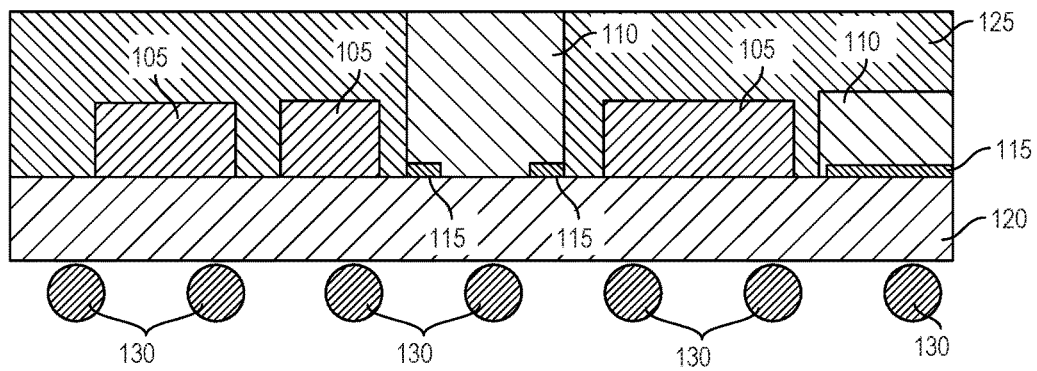

As shown in FIG. 1B, an overmold 125 is formed on the substrate 120, electronics devices 105, and sacrificial structures 110. For sacrificial structures 110 designed to be decomposed using heat, the overmolding curing temperature, overmolding material, and sacrificial structures 110 are selected to ensure the sacrificial structures 110 do not decompose at or below the molding temperature. FIG. 1C shows the application of solder balls 130, such as using stencil print or ball-grid array (BGA) solder ball attachment. The process used to apply solder balls 130 is also selected to ensure the sacrificial structures 110 do not decompose. For example, the solder attachment may use a controlled solder reflow process at a temperature below the thermal decomposition temperature of the sacrificial structures 110.

Figure 1D:
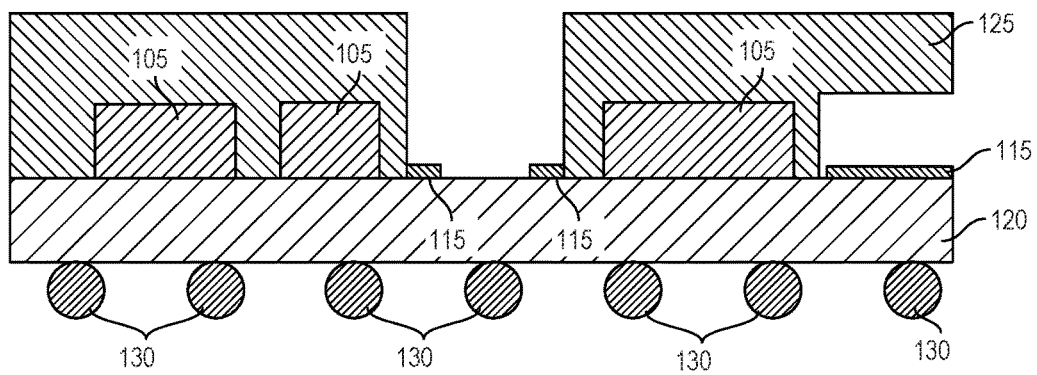

FIG. 1D shows removal of the sacrificial structures 110. Depending on the type of material within the sacrificial structures 110, the material is decomposed by its designated decomposition method. For example, when the sacrificial structures 110 include a thermally decomposable material, the sacrificial structures 110 may be decomposed using reflow oven (e.g., cure oven). The thermally decomposable material may be selected to have an associated thermal decomposition temperature that is below, at, or above a solder reflow temperature. For example, using a thermal decomposition temperature below the solder reflow temperature enables decomposition of the sacrificial structures 110 without reflowing solder, such as may be used to remove the sacrificial structures 110 without disturbing solder attachments or to remove the sacrificial material and melt the solder in a single step. Conversely, a thermal decomposition temperature above the solder reflow temperature enables reflowing the solder without decomposing the sacrificial structures 110, such as may be used to attach an SMT component without removing sacrificial structures 110. In an example, solder ball attachment follows decomposition and removal of the sacrificial structures 110. In another example, solder ball attachment is not performed.

Multiple sacrificial structures 110 may be formed using differing materials to enable greater control over subsequent manufacturing processes. For example, differing sacrificial materials may be thermally decomposable at different temperatures, or one sacrificial material may be thermally decomposable and another may be chemically decomposable. Other sacrificial materials could also be used, such as ultraviolet (UV) decomposable materials, infrared (IR) decomposable materials, water soluble materials, or other sacrificial materials. Examples of sacrificial materials include polyalkylene copolymers, polycarbonate copolymers, polypropylene carbonates, water soluble resins, or other sacrificial materials. The use of multiple different materials enables greater control over specific subsequent steps within the manufacturing processes. In an example, a first group of sacrificial structures 110 are removed and replaced with SMT components, and a second group of sacrificial structures 110 may be removed during a subsequent manufacturing process step. In another example, a first sacrificial material is removed and replaced with an SMT component during a first post-overmolding step, where a second sacrificial material is used as a mechanical support or placement guide for the SMT component placement.

The removal of sacrificial structures 110 provides one or more openings within the overmold 125, where the openings allow for various features. In an example, the openings allow for placement of a component following the overmolding process. For example, this allows for placement of components that would be damaged by temperatures required during the overmolding process or SMT process, such as a thermally sensitive magnetic component. The openings also allow for post-overmolding placement of components that have an associated keep-out-zone (KOZ), where the KOZ is area on the substrate 120 that must be kept vacant to allow for cooling or subsequent component mounting.

In addition to component placement, the openings provide for subsequent attachment of various connectors. The connector openings may be designed to simplify connections, such as using right-angle openings on a side of the substrate 120. In another example, the openings provide access to ambient, such as may be required by a chemical or optical sensor.

The openings also allow for formation of versatile system-in-package (SIP) modules, where a SIP is a collection of multiple integrated circuits integrated into a single electronics module (e.g., electronics package). In an example, a Global Positioning System (GPS) module is fabricated using sacrificial structures 110, an overmold 125 is applied to obscure SIP components, and the sacrificial structures 110 are removed to reveal SIP-to-PCB or SIP-to-SIP connectors.

Though FIG. 1D shows openings with rectangular cross sections, more complex shapes may be used to provide additional features. For example, in the case of the connector, a sacrificial structure 110 may create a mechanical interference (e.g., tab, key) such that only specific connectors may be used, or such that a connector only fits in a specific orientation. In a similar example, a sacrificial structure 110 provides a device-specific mechanical interference to ensure device compatibility or reduce unintended or unauthorized use. For example, a specific board configuration may be used in various versions of a smartphone, where a specific subset of sacrificial structures 110 may be removed for each version of the smartphone to attach a different set of sensors or connectors. Additionally, the sacrificial structures 110 may be removed by using a specific dissolution chemical or multiple-step process, where the chemical or multiple-step process is only provided to authorized manufacturers or integrators. In various examples, sacrificial material cavity formation 100 is used to form a single package or multiple packages, where multiple packages may be created in a linear strip or 2-D array and subsequently singulated (e.g., separated). Additional structures or channels may be formed, such as shown in FIG. 2.

Figure 2:
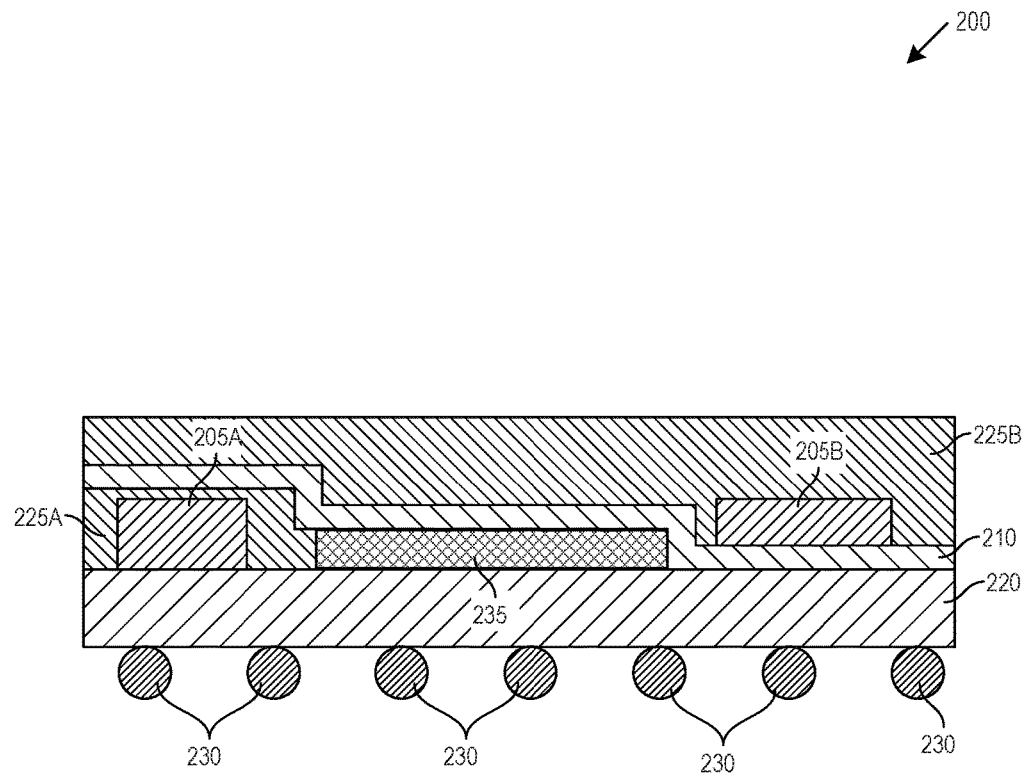
FIG. 2 is a block diagram of complex channel cavity formation, in accordance with at least one embodiment of the invention.

FIG. 2 is a block diagram of complex channel cavity formation 200, in accordance with at least one embodiment of the invention. In contrast with other drilling methods that create linear openings, the use of a sacrificial layer can be used to create complex channels, such as using multiple smaller channels (e.g., microchannels) to provide access to ambient. In this embodiment, the electronic package formation includes attaching solder balls 230 and one or more electronic components 205 to package substrate 220. A first electronic component 205A and component 235 is attached to the package substrate 220. The component 235 may include an ambient-sensitive electronic component, a thermogenic IC die that requires a cooling channel, or other component 235. Following placement of component 235, a first overmold 225A is applied to the first electronic component 205A and ambient-sensitive component 235. A sacrificial layer 210 is applied to the first overmold 225A and the ambient-sensitive component 235. In an example, for complex (e.g., multi-channel) or large sacrificial layer 210 geometries that are difficult to produce using stencil printing, the sacrificial layer 210 is preformed using a mold, a stamping method, or alternative sacrificial layer 210 formation process.

Various techniques may be used to detect the use of a sacrificial material. In an example, the complexity of the channel is used to determine if a product was formed using methods described herein. Some existing industry approaches have associated features, such as drilling in a straight line or using a molding feature (e.g., a tab) that is extracted when the mold is removed. In an example, the use of a sacrificial material is detectable by examining the shape of an elongated chamber, such as by identifying multiple bends (e.g., multiple inflection points) or sharp angles (e.g., 90 degrees or greater) may not be possible by drilling. In an example, the use of a sacrificial material is detectable by examining the geometry of a chamber, such as by examining wall chamfers (e.g., inner edge beveling). For example, a sacrificial material may be used to generate a chamber whose lower portion is wider than the upper portion from which the sacrificial material is removed, but a non-sacrificial material used in the same chamber would not be able to be extracted. In an example, various surfaces are examined to identify materials used in the sacrificial material deposition and removal process. For example, the sacrificial material removal process may leave traces of the sacrificial material, or may leave traces of the chemicals used to remove the sacrificial material or rinse the chamber. In an example, a material is added to the sacrificial material to enhance detectability, where the material may be selected to not be removable by the same removal process as used in removing the sacrificial material.

Following application of the sacrificial layer 210, a second electronic component 205B is applied to the sacrificial layer 210, and a second overmold 225B is applied to the sacrificial layer 210 and to second electronic component 205B. Finally, the sacrificial layer 210 is removed to produce a complex cavity adjacent to the ambient-sensitive component 235. In an example, the area previously occupied by the sacrificial layer 210 is left open to ambient, such as when using air to provide a desired index of refraction at the device-air boundary of component 235. In another example, the area previously occupied by the sacrificial layer 210 is filled with a material with specific properties, such as an electrically conductive dielectric paste or thermally conductive thermal interface material (TIM). In an example, various intermediate steps of the complex channel cavity formation 200 may be used to provide a device that includes an exposed sacrificial layer 210. For example, following the placement of the second electronic component 205B or the second overmold 225B, the resulting device includes sacrificial layer 210 that is exposed on at least two ends. This intermediate step allows for later application of an electronic device or a different type of overmold, and provides electrical and physical isolation of the first electronic component 205A.

The sacrificial layer 210 geometry, overmolds 225A and 225B, and various other components are organized to provide an escape path for the dissolving sacrificial layer 210. The escape path may include a ventilation path for gas to escape, a leakage path for a solution to escape, a channel through which a dissolving or cleaning material is passed, or a combination of escape paths. Additionally, overmolds 225A and 225B or other components may be formed using organic or other materials that allow for diffusion of materials from dissolving the sacrificial layer 210. The escape or diffusion path is selected to be compatible with the sacrificial material, and multiple different paths may be select to correspond to multiple different types of sacrificial materials. The escape path or sacrificial material may be selected such that not all of the sacrificial material is removed. For example, the sacrificial material may include a thermally conductive material or a corrosion-retardant material, where the removal of the sacrificial material results in application of the thermally conductive or corrosion-retardant material to an internal surface. In other example, a sacrificial material may include a marking substance to detect the use of the specific sacrificial material or removal method, where the removal of the sacrificial material results in application of the marking substance to an internal surface.

Figure 3A:
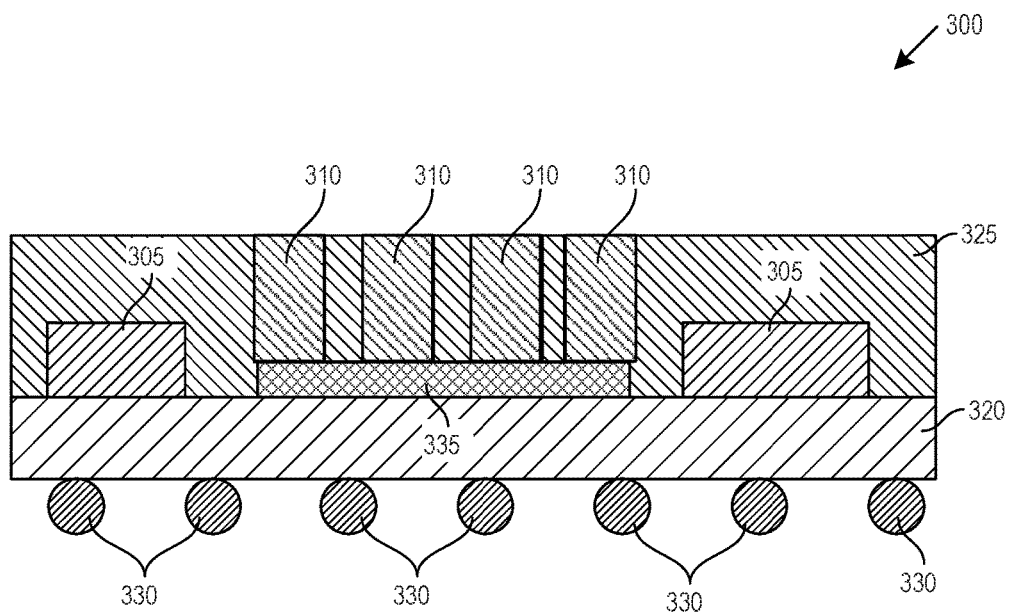
FIGS. 3A-3B are a block diagrams of a cavity formation application, in accordance with at least one embodiment of the invention.
Figure 3B:
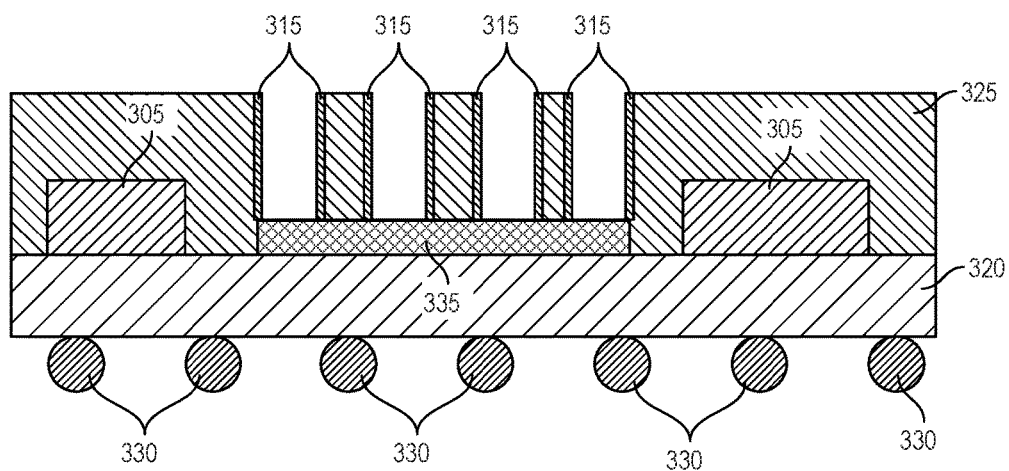

FIGS. 3A-3B are block diagrams of a cavity formation application 300, in accordance with at least one embodiment of the invention. The cavity formation application 300 shown in FIGS. 3A-3B includes using a sacrificial material to form thermally conductive vents, such as those used in complex finned or channeled heat sinks. Application 300 includes applying solder 330, electronic components 305, and a thermogenic component 335 onto a substrate 320. Sacrificial structures 310 are disposed on the thermogenic component 335, and an overmold 325 is applied, resulting in the structure shown in FIG. 3A.

In an example, following application of the overmold 325, the sacrificial structures 310 are removed, and thermally conductive structures 315 are disposed within the voids to conduct heat away from the thermogenic component 335. The thermally conductive structures 315 may be preformed structures attached to the walls of the overmold 325, or may include a thermally conductive material sputtered or vacuum injected into the cavity left by the removal of the sacrificial structures 310. In another example, the thermally conductive structures 315 are applied to sacrificial structures 310 before placement of sacrificial structures 310, such as by sputtering the sacrificial structures 310 with copper or another metal. In another example, the sacrificial structures 310 may be formed within thermally conductive structures 315, such as by injecting a sacrificial material within a thermally conductive shell.

Figure 4A:
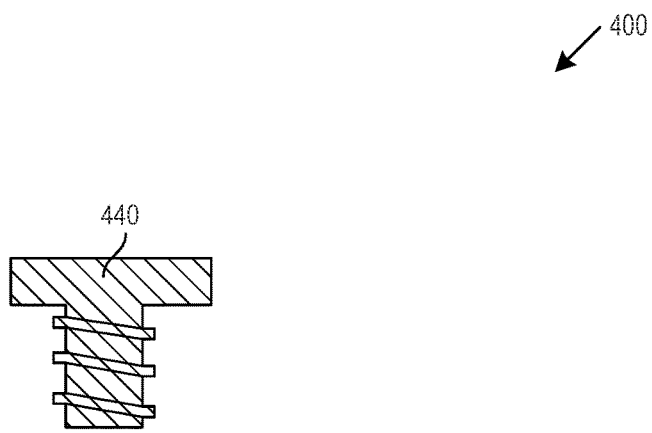
FIG. 4A-4C are block diagrams of complex cavity formation, in accordance with at least one embodiment of the invention.
Figure 4B:
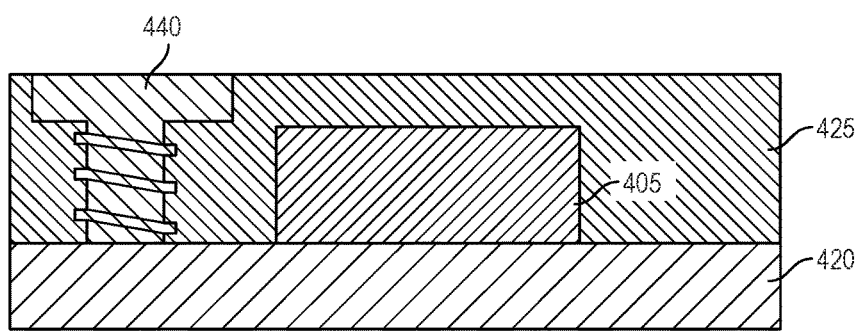
Figure 4C:
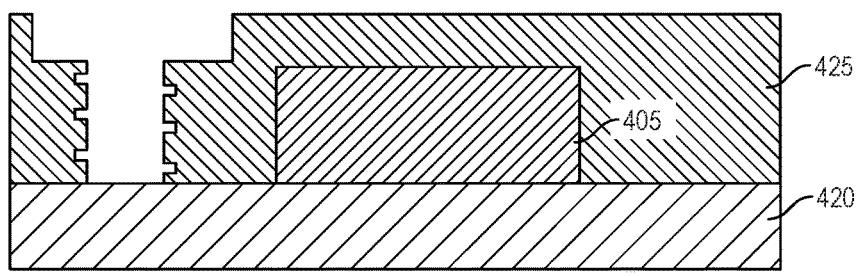

FIG. 4A-4C are block diagrams of complex cavity formation 400, in accordance with at least one embodiment of the invention. Complex cavity formation 400 includes forming a complex sacrificial structure 440, such as the threaded screw shown in FIG. 4A. As shown in FIG. 4B, the complex sacrificial structure 440 and electronic components 405 are applied to a package substrate 420. An overmold 425 is formed around the complex sacrificial structure 440 and electronic components 405. The complex sacrificial structure 440 is removed, resulting in the formation of the complex cavity shown in FIG. 4C. In an example, the complex cavity formation 400 is used to form a mechanical guide, such as may be used to attach an external device to overmold 425 using a screw. In another example, the complex cavity formation 400 is used to form an electrical connection, such as may be used to attach a grounding screw through the overmold 425 to the package substrate 420.

Figure 5:
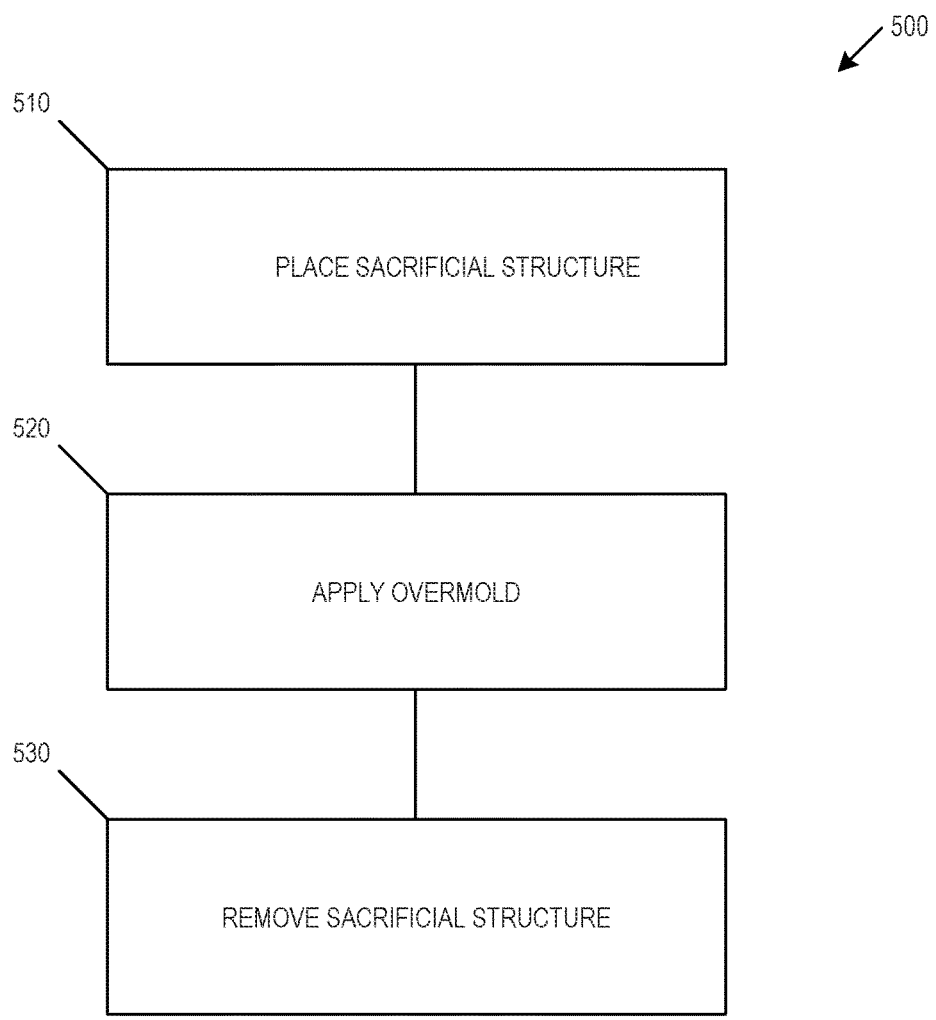
FIG. 5 is a flowchart of a complex cavity application method, in accordance with at least one embodiment of the invention.

FIG. 5 is a flowchart of a complex cavity application method 500, in accordance with at least one embodiment of the invention. Method 500 includes placing 510 a sacrificial material on or within an electronics package. The sacrificial material is placed on a substrate, an electronic component, or another surface. In various examples, the sacrificial material is dispensed, applied through a stencil print process, 3-D printed, or applied using another application process. An overmold is applied 520 to the sacrificial material and electronics package. The sacrificial material is removed 530, such as by decomposing, washing, or etching away this sacrificial material, resulting in a cavity or channel.

Figure 6:
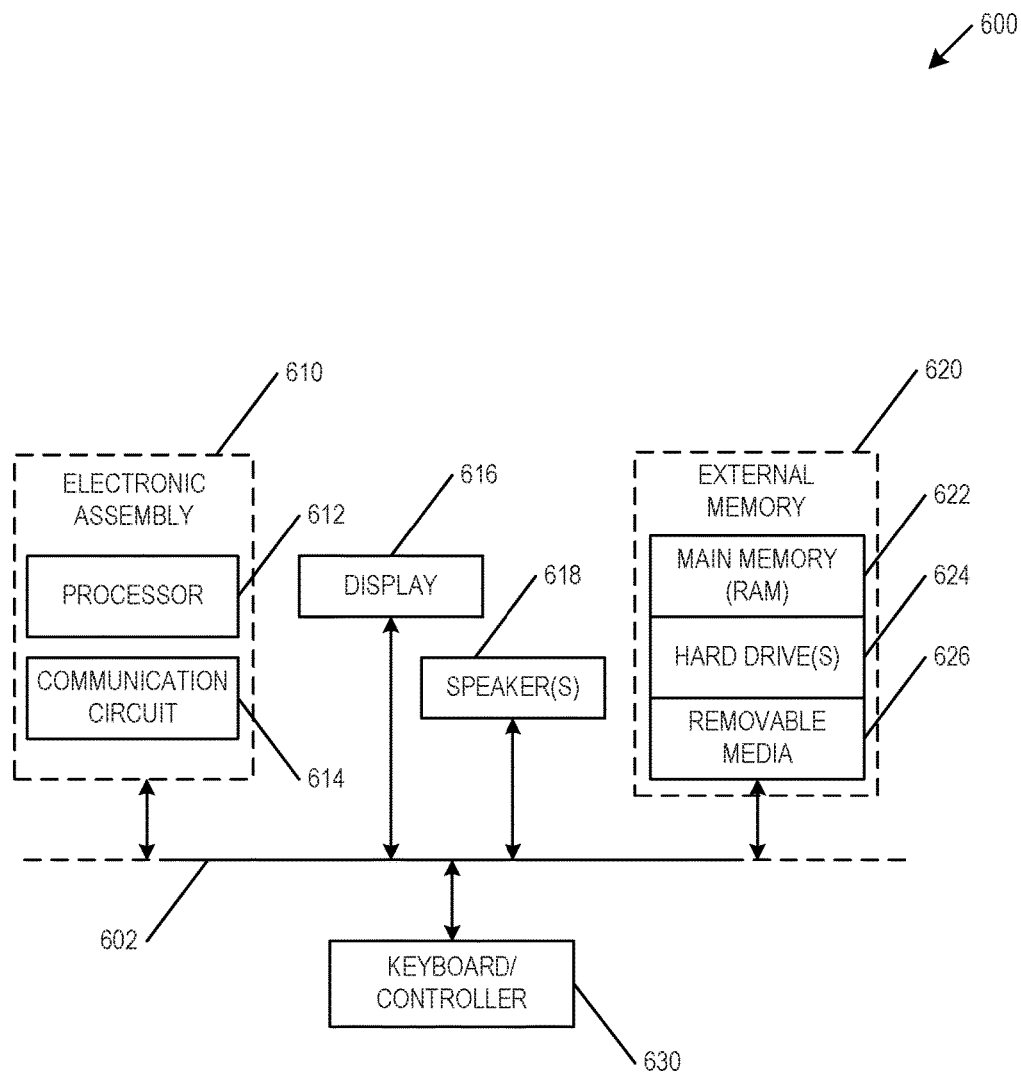
FIG. 6 is a block diagram of an electronic device incorporating a complex cavity apparatus or method in accordance with at least one embodiment of the invention.

FIG. 6 is a block diagram of an electronic device incorporating a complex cavity apparatus 600 or method, in accordance with at least one embodiment of the invention. FIG. 6 shows an example of an electronic device using semiconductor chip assemblies and solders as described in the present disclosure is included to show an example of a higher-level device application for the present invention. Electronic device 600 is merely one example of an electronic system in which embodiments of the present invention can be used. Examples of electronic devices 600 include, but are not limited to personal computers, tablet computers, mobile telephones, game devices, MP3 or other digital music players, etc. In this example, electronic device 600 comprises a data processing system that includes a system bus 602 to couple the various components of the system. System bus 602 provides communications links among the various components of the electronic device 600 and can be implemented as a single bus, as a combination of busses, or in any other suitable manner.

An electronic assembly 610 is coupled to system bus 602. The electronic assembly 610 can include any circuit or combination of circuits. In one embodiment, the electronic assembly 610 includes a processor 612 that can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 610 are a custom circuit, an application-specific integrated circuit (ASIC), or the like, such as, for example, one or more circuits (such as a communications circuit 614) for use in wireless devices like mobile telephones, personal data assistants, portable computers, two-way radios, and similar electronic systems. The IC can perform any other type of function.

The electronic device 600 can also include an external memory 620, which in turn can include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic device 600 can also include a display device 616, one or more speakers 618, and a keyboard and/or controller 630, which can include a mouse, trackball, touch screen, voice-recognition device, or any other device that permits a system user to input information into and receive information from the electronic device 600.

To better illustrate the method and apparatuses disclosed herein, a non-limiting list of embodiments is provided here:

Example 1 is a method comprising: disposing a sacrificial material on an electrical component; disposing an overmold on the sacrificial material; and removing the sacrificial material.

In Example 2, the subject matter of Example 1 optionally includes wherein the electronic component is disposed on a printed circuit board (PCB).

In Example 3, the subject matter of any one or more of Examples 1-2 optionally include wherein the electronic component includes an optical electronic component.

In Example 4, the subject matter of Example 3 optionally includes wherein the overmold includes a material selected to provide a desired optical property to the optical electronic component.

In Example 5, the subject matter of any one or more of Examples 1-4 optionally include wherein the overmold includes a material selected to provide a desired structural property.

In Example 6, the subject matter of Example 5 optionally includes wherein the desired structural property includes avoiding warping following removal of the sacrificial material.

In Example 7, the subject matter of any one or more of Examples 1-6 optionally include wherein the electronic component includes a thermogenic electronic component.

In Example 8, the subject matter of Example 7 optionally includes wherein the thermogenic electronic component includes a processor.

In Example 9, the subject matter of any one or more of Examples 1-8 optionally include wherein: the sacrificial material includes a first portion proximate to the electronic component and a second portion proximate to the overmold; and the first portion is wider than the second portion.

In Example 10, the subject matter of any one or more of Examples 1-9 optionally include wherein the sacrificial material includes a channel.

In Example 11, the subject matter of Example 10 optionally includes wherein the channel is nonlinear.

In Example 12, the subject matter of Example 11 optionally includes wherein the nonlinear channel includes multiple paths.

In Example 13, the subject matter of any one or more of Examples 10-12 optionally include wherein the channel includes a first opening to facilitate removal of the sacrificial material.

In Example 14, the subject matter of Example 13 optionally includes wherein the channel includes a second opening to provide a flow path between the first opening and the second opening.

In Example 15, the subject matter of any one or more of Examples 1-14 optionally include wherein the sacrificial material includes a preformed sacrificial object.

In Example 16, the subject matter of Example 15 optionally includes wherein: the sacrificial object is formed in the shape of a device to be installed in the overmold; and the removal of the sacrificial material creates a receptacle for the device.

In Example 17, the subject matter of any one or more of Examples 1-16 optionally include wherein removing the sacrificial material includes applying an optical process to the sacrificial material.

In Example 18, the subject matter of any one or more of Examples 1-17 optionally include wherein removing the sacrificial material includes applying heat to the sacrificial material.

In Example 19, the subject matter of any one or more of Examples 1-18 optionally include wherein removing the sacrificial material includes applying a chemical process to dissolve the sacrificial material.

In Example 20, the subject matter of any one or more of Examples 1-19 optionally include wherein removing the sacrificial material exposes a thermal channel.

In Example 21, the subject matter of Example 20 optionally includes applying a thermally conductive material to the exposed thermal channel.

In Example 22, the subject matter of any one or more of Examples 1-21 optionally include wherein removing the sacrificial material exposes an electrical contact.

In Example 23, the subject matter of any one or more of Examples 1-22 optionally include wherein removing the sacrificial material exposes an optical component.

Example 24 is a machine-readable medium including instructions, which when executed by a computing system, cause the computing system to perform any of the methods of Examples 1-23.

Example 25 is an apparatus comprising means for performing any of the methods of Examples 1-23.

Example 26 is an apparatus comprising: an electronic component; an overmold disposed on the electronic component; and a cavity adjacent to at least a portion of the electronic component, the cavity formed from the removal of a sacrificial material previously disposed on the electronic component.

In Example 27, the subject matter of Example 26 optionally includes wherein the electronic component is disposed on a printed circuit board (PCB).

In Example 28, the subject matter of any one or more of Examples 26-27 optionally include wherein the electronic component includes an optical electronic component.

In Example 29, the subject matter of Example 28 optionally includes wherein the overmold includes a material selected to provide a desired optical property to the optical electronic component.

In Example 30, the subject matter of any one or more of Examples 26-29 optionally include wherein the overmold includes a material selected to provide a desired structural property.

In Example 31, the subject matter of Example 30 optionally includes wherein the desired structural property includes avoiding warping following removal of the sacrificial material.

In Example 32, the subject matter of any one or more of Examples 26-31 optionally include wherein the electronic component includes a thermogenic electronic component.

In Example 33, the subject matter of Example 32 optionally includes wherein the thermogenic electronic component includes a processor.

In Example 34, the subject matter of any one or more of Examples 26-33 optionally include wherein: the cavity includes a first portion proximate to the substrate and a second portion proximate to the overmold; and the first portion is wider than the second portion.

In Example 35, the subject matter of any one or more of Examples 26-34 optionally include wherein the cavity includes a channel structure.

In Example 36, the subject matter of Example 35 optionally includes wherein the channel structure is nonlinear.

In Example 37, the subject matter of Example 36 optionally includes wherein the nonlinear channel structure includes multiple paths.

In Example 38, the subject matter of any one or more of Examples 35-37 optionally include wherein the channel includes a first opening to facilitate removal of the sacrificial material.

In Example 39, the subject matter of Example 38 optionally includes wherein the channel includes a second opening to provide a flow path between the first opening and the second opening.

In Example 40, the subject matter of any one or more of Examples 26-39 optionally include wherein: the cavity is formed in the shape of a device to be installed in the overmold; and the cavity formed from the removal of the sacrificial material forms a receptacle for the device.

In Example 41, the subject matter of any one or more of Examples 26-40 optionally include wherein the cavity includes a thermal channel.

In Example 42, the subject matter of Example 41 optionally includes a thermally conductive material disposed in the thermal channel.

In Example 43, the subject matter of any one or more of Examples 26-42 optionally include wherein the cavity includes an electrical contact exposed by removing the sacrificial material.

In Example 44, the subject matter of any one or more of Examples 26-43 optionally include wherein the cavity includes an optical component exposed by removing the sacrificial material.

Example 45 is an apparatus comprising: an electronic component; a sacrificial material disposed on the electronic component, the sacrificial material being removable to provide a cavity; and an overmold disposed on the sacrificial material.

In Example 46, the subject matter of Example 45 optionally includes wherein the electronic component is disposed on a printed circuit board (PCB).

In Example 47, the subject matter of any one or more of Examples 45-46 optionally include wherein the electronic component includes an optical electronic component.

In Example 48, the subject matter of Example 47 optionally includes wherein the overmold includes a material selected to provide a desired optical property to the optical electronic component.

In Example 49, the subject matter of any one or more of Examples 45-48 optionally include wherein the overmold includes a material selected to provide a desired structural property.

In Example 50, the subject matter of Example 49 optionally includes wherein the desired structural property includes avoiding warping following removal of the sacrificial material.

In Example 51, the subject matter of any one or more of Examples 45-50 optionally include wherein the electronic component includes a thermogenic electronic component.

In Example 52, the subject matter of Example 51 optionally includes wherein the thermogenic electronic component includes a processor.

In Example 53, the subject matter of any one or more of Examples 45-52 optionally include wherein: the sacrificial material includes a first portion proximate to the substrate and a second portion proximate to the overmold; and the first portion is wider than the second portion.

In Example 54, the subject matter of any one or more of Examples 45-53 optionally include wherein the sacrificial material includes a channel structure.

In Example 55, the subject matter of Example 54 optionally includes wherein the channel structure is nonlinear.

In Example 56, the subject matter of Example 55 optionally includes wherein the nonlinear channel structure includes multiple paths.

In Example 57, the subject matter of any one or more of Examples 54-56 optionally include wherein the channel includes a first opening to facilitate removal of the sacrificial material.

In Example 58, the subject matter of Example 57 optionally includes wherein the channel includes a second opening to provide a flow path between the first opening and the second opening.

In Example 59, the subject matter of any one or more of Examples 45-58 optionally include wherein the sacrificial material includes a preformed sacrificial object.

In Example 60, the subject matter of Example 59 optionally includes wherein: the sacrificial object is formed in the shape of a device to be installed in the overmold; and the cavity formed from the removal of the sacrificial material forms a receptacle for the device.

In Example 61, the subject matter of any one or more of Examples 45-60 optionally include wherein the sacrificial material includes a material that is removable by an optical process.

In Example 62, the subject matter of any one or more of Examples 45-61 optionally include wherein the sacrificial material includes a material that is removable by a thermal process.

In Example 63, the subject matter of any one or more of Examples 45-62 optionally include wherein the sacrificial material includes a material that is removable by a chemical process.

In Example 64, the subject matter of any one or more of Examples 45-63 optionally include wherein the cavity includes a thermal channel.

In Example 65, the subject matter of Example 64 optionally includes a thermally conductive material disposed in the thermal channel.

In Example 66, the subject matter of any one or more of Examples 45-65 optionally include wherein the cavity includes an electrical contact exposed by removing the sacrificial material.

In Example 67, the subject matter of any one or more of Examples 45-66 optionally include wherein the cavity includes an optical component exposed by removing the sacrificial material.

Example 68 is at least one machine-readable storage medium, comprising a plurality of instructions that, responsive to being executed with processor circuitry of a computer-controlled device, cause the computer-controlled device to: dispose a sacrificial material on an electrical component; dispose an overmold on the sacrificial material; and remove the sacrificial material.

In Example 69, the subject matter of Example 68 optionally includes wherein the electronic component is disposed on a printed circuit board (PCB).

In Example 70, the subject matter of any one or more of Examples 68-69 optionally include wherein the electronic component includes an optical electronic component.

In Example 71, the subject matter of Example 70 optionally includes wherein the overmold includes a material selected to provide a desired optical property to the optical electronic component.

In Example 72, the subject matter of any one or more of Examples 68-71 optionally include wherein the overmold includes a material selected to provide a desired structural property.

In Example 73, the subject matter of Example 72 optionally includes wherein the desired structural property includes avoiding warping following removal of the sacrificial material.

In Example 74, the subject matter of any one or more of Examples 68-73 optionally include wherein the electronic component includes a thermogenic electronic component.

In Example 75, the subject matter of Example 74 optionally includes wherein the thermogenic electronic component includes a processor.

In Example 76, the subject matter of any one or more of Examples 68-75 optionally include wherein: the sacrificial material includes a first portion proximate to the electronic component and a second portion proximate to the overmold; and the first portion is wider than the second portion.

In Example 77, the subject matter of any one or more of Examples 68-76 optionally include wherein the sacrificial material includes a channel.

In Example 78, the subject matter of Example 77 optionally includes wherein the channel is nonlinear.

In Example 79, the subject matter of Example 78 optionally includes wherein the nonlinear channel includes multiple paths.

In Example 80, the subject matter of any one or more of Examples 77-79 optionally include wherein the channel includes a first opening to facilitate removal of the sacrificial material.

In Example 81, the subject matter of Example 80 optionally includes wherein the channel includes a second opening to provide a flow path between the first opening and the second opening.

In Example 82, the subject matter of any one or more of Examples 68-81 optionally include wherein the sacrificial material includes a preformed sacrificial object.

In Example 83, the subject matter of Example 82 optionally includes wherein: the sacrificial object is formed in the shape of a device to be installed in the overmold; and the removal of the sacrificial material creates a receptacle for the device.

In Example 84, the subject matter of any one or more of Examples 68-83 optionally include wherein removing the sacrificial material includes applying an optical process to the sacrificial material.

In Example 85, the subject matter of any one or more of Examples 68-84 optionally include wherein removing the sacrificial material includes applying heat to the sacrificial material.

In Example 86, the subject matter of any one or more of Examples 68-85 optionally include wherein removing the sacrificial material includes applying a chemical process to dissolve the sacrificial material.

In Example 87, the subject matter of any one or more of Examples 68-86 optionally include wherein removing the sacrificial material exposes a thermal channel.

In Example 88, the subject matter of Example 87 optionally includes the instructions further causing the computer-controlled device to applying a thermally conductive material to the exposed thermal channel.

In Example 89, the subject matter of any one or more of Examples 68-88 optionally include wherein removing the sacrificial material exposes an electrical contact.

In Example 90, the subject matter of any one or more of Examples 68-89 optionally include wherein removing the sacrificial material exposes an optical component.

Example 91 is an apparatus comprising: means for disposing a sacrificial material on an electrical component; means for disposing an overmold on the sacrificial material; and means for removing the sacrificial material.

In Example 92, the subject matter of Example 91 optionally includes wherein the electronic component is disposed on a printed circuit board (PCB).

In Example 93, the subject matter of any one or more of Examples 91-92 optionally include wherein the electronic component includes an optical electronic component.

In Example 94, the subject matter of Example 93 optionally includes wherein the overmold includes a material selected to provide a desired optical property to the optical electronic component.

In Example 95, the subject matter of any one or more of Examples 91-94 optionally include wherein the overmold includes a material selected to provide a desired structural property.

In Example 96, the subject matter of Example 95 optionally includes wherein the desired structural property includes avoiding warping following removal of the sacrificial material.

In Example 97, the subject matter of any one or more of Examples 91-96 optionally include wherein the electronic component includes a thermogenic electronic component.

In Example 98, the subject matter of Example 97 optionally includes wherein the thermogenic electronic component includes a processor.

In Example 99, the subject matter of any one or more of Examples 91-98 optionally include wherein: the sacrificial material includes a first portion proximate to the electronic component and a second portion proximate to the overmold; and the first portion is wider than the second portion.

In Example 100, the subject matter of any one or more of Examples 91-99 optionally include wherein the sacrificial material includes a channel.

In Example 101, the subject matter of Example 100 optionally includes wherein the channel is nonlinear.

In Example 102, the subject matter of Example 101 optionally includes wherein the nonlinear channel includes multiple paths.

In Example 103, the subject matter of any one or more of Examples 100-102 optionally include wherein the channel includes a first opening to facilitate removal of the sacrificial material.

In Example 104, the subject matter of Example 103 optionally includes wherein the channel includes a second opening to provide a flow path between the first opening and the second opening.

In Example 105, the subject matter of any one or more of Examples 91-104 optionally include wherein the sacrificial material includes a preformed sacrificial object.

In Example 106, the subject matter of Example 105 optionally includes wherein: the sacrificial object is formed in the shape of a device to be installed in the overmold; and the removal of the sacrificial material creates a receptacle for the device.

In Example 107, the subject matter of any one or more of Examples 91-106 optionally include wherein means for removing the sacrificial material includes means for applying an optical process to the sacrificial material.

In Example 108, the subject matter of any one or more of Examples 91-107 optionally include wherein means for removing the sacrificial material includes means for applying heat to the sacrificial material.

In Example 109, the subject matter of any one or more of Examples 91-108 optionally include wherein means for removing the sacrificial material includes means for applying a chemical process to dissolve the sacrificial material.

In Example 110, the subject matter of any one or more of Examples 91-109 optionally include wherein means for removing the sacrificial material exposes a thermal channel.

In Example 111, the subject matter of Example 110 optionally includes applying a thermally conductive material to the exposed thermal channel.

In Example 112, the subject matter of any one or more of Examples 91-111 optionally include wherein means for removing the sacrificial material exposes an electrical contact.

In Example 113, the subject matter of any one or more of Examples 91-112 optionally include wherein means for removing the sacrificial material exposes an optical component.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:
1. A method comprising:
disposing a sacrificial material on an electronic component, the electronic component disposed on a printed circuit board (PCB);
disposing an overmold on the sacrificial material; and
removing the sacrificial material.

2. The method of claim 1, wherein:
the sacrificial material includes a first portion proximate to the electronic component and a second portion proximate to the overmold; and
the first portion is wider than the second portion.

3. The method of claim 1, wherein the sacrificial material includes a channel.

4. The method of claim 3, wherein the channel is nonlinear.

5. The method of claim 1, wherein the sacrificial material includes a preformed sacrificial object.

6. The method of claim 5, wherein:
the sacrificial object is formed in the shape of a device to be installed in the overmold; and
the removal of the sacrificial material creates a receptacle for the device.

7. An apparatus comprising:
an electronic component disposed on a printed circuit board (PCB);
an overmold disposed on the electronic component; and
a cavity adjacent to at least a portion of the electronic component, the cavity formed from the removal of a sacrificial material previously disposed on the electronic component.

8. The apparatus of claim 7, wherein the electronic component includes an optical electronic component.

9. The apparatus of claim 8, wherein the overmold includes a material selected to provide a desired optical property to the optical electronic component.

10. The apparatus of claim 7, wherein the overmold includes a material selected to provide a desired structural property.

11. The apparatus of claim 7, wherein:
the cavity includes a first portion proximate to the substrate and a second portion proximate to the overmold; and
the first portion is wider than the second portion.

12. The apparatus of claim 7, wherein the cavity includes a channel structure.

13. The apparatus of claim 7, wherein:
the cavity is formed in the shape of a device to be installed in the overmold; and
the cavity formed from the removal of the sacrificial material forms a receptacle for the device.

14. An apparatus comprising:
an electronic component disposed on a printed circuit board (PCB);
a sacrificial material disposed on the electronic component, the sacrificial material being removable to provide a cavity; and
an overmold disposed on the sacrificial material.

15. The apparatus of claim 14, wherein the electronic component includes an optical electronic component.

16. The apparatus of claim 15, wherein the overmold includes a material selected to provide a desired optical property to the optical electronic component.

17. The apparatus of claim 14, wherein the overmold includes a material selected to provide a desired structural property.

18. The apparatus of claim 14, wherein:
the sacrificial material includes a first portion proximate to substrate and a second portion proximate to the overmold; and
the first portion is wider than the second portion.

19. The apparatus of claim 14, wherein the sacrificial material includes a channel structure.

20. The apparatus of claim 14, wherein the sacrificial material includes a preformed sacrificial object.

21. The apparatus of claim 20, wherein:
the sacrificial object is formed in the shape of a device to be installed in the overmold; and
the cavity formed from the removal of the sacrificial material forms a receptacle for the device.

* * * * *